(12) United States Patent
Hult (10) Patent No.: US 7,714,984 B2
(45) Date of Patent: May 11, 2010

(54) RESIDUAL PUPIL ASYMMETRY COMPENSATOR FOR A LITHOGRAPHY SCANNER

(75) Inventor: David A. Hult, Danbury, CT (US)

(73) Assignee: ASML Holding N.V., Veldhoven (NL)

( * ) Notice: Subject to any disclaimer, the term of this patent is extended or adjusted under 35 U.S.C. 154(b) by 378 days.

(21) Appl. No.: 11/692,614

(22) Filed: Mar. 28, 2007

(65) Prior Publication Data

US 2008/0239258 A1  Oct. 2, 2008

(51) Int. Cl.
G03B 27/54  (2006.01)
G03B 27/32  (2006.01)

(52) U.S. Cl. .......................................... 355/67; 355/77

(58) Field of Classification Search ................... 355/67, 355/69, 53, 77; 356/400, 399, 401
See application file for complete search history.

(56) References Cited

U.S. PATENT DOCUMENTS 6,097,474 A * 8/2000 McCullough et al. ......... 355/69
2001/0055103 A1 * 12/2001 Nishi ........................... 355/53
2003/0002021 A1 * 1/2003 Sato ............................. 355/67
2007/0103665 A1   5/2007 Zimmerman et al.

* cited by examiner

*Primary Examiner*—Peter B Kim
(74) *Attorney, Agent, or Firm*—Sterne, Kessler, Goldstein & Fox P.L.L.C.

(57) ABSTRACT

A uniformity correction system may be used as an actuator for the correction of asymmetry scan-integrated illumination pupil fill that varies in the non-scanning direction of a lithography system. Instead of minimizing asymmetric opaque element insertion, opaque elements are inserted into an illumination beam to introduce an additional pupil asymmetry into the illumination beam. The compensating pupil asymmetry substantially nulls the original pupil asymmetry. To introduce the pupil asymmetry, a first opaque element can be moved into or out of the illumination beam in tandem with a second, opposing opaque element. Iterative feedback of both uniformity and pupil asymmetry ensure that both are substantially simultaneously optimized.

17 Claims, 9 Drawing Sheets

RESIDUAL PUPIL ASYMMETRY COMPENSATOR FOR A LITHOGRAPHY SCANNER

BACKGROUND

1. Field of the Invention

The present invention relates to lithography scanners, specifically correcting pupil asymmetry in the illumination beams of lithography scanners.

2. Background Art

Conventional lithography scanners include, among other things, an illumination system that produces a uniform intensity distribution of illumination, which is produced from a received laser beam. It is desirable that the resulting scan-integrated illumination beam profile be as uniform as possible and that any uniformity errors be kept as small as possible. This is because illumination uniformity influences the ability of a lithography scanner to produce uniform line widths across an entire exposure field. Illumination uniformity errors can significantly impact the quality of devices produced by the lithography system.

One example of a popular conventional lithography system is a step and scan system (sometimes referred to as a scanner). A step and scan system creates an illuminated slot narrower than one exposure field. The system then scans the reticle and wafer synchronously by the slot to expose each field on the wafer. This process is repeated. Because of the nature of the system's operation, radiation energy in the scan direction is integrated, and as a result dose on the photo-active coating on the substrate can be non-uniform. Non-uniformity in the dose causes printing errors and degraded device performance.

Some lithography systems use uniformity correction systems to make the scan-integrated intensity profile uniform. Some of these uniformity correction systems achieve this effect by inserting attenuating or opaque (collectively referred to herein as attenuating) elements into the illumination edge beam at or near a focal plane, located between a pupil and a focus plane. Asymmetrically inserting attenuating elements (opposed attenuating elements inserted non-equal distances) near a focal plane asymmetrically apodizes the illumination pupil, and vignettes the illumination pupil. Varying the asymmetric insertion along the non-scanning direction causes a variation in pupil asymmetry.

Modern lithography scanners typically use intensity measurements and sophisticated algorithms to determine the correct position for the uniformity correction attenuating elements. The attenuating elements are positioned with consideration of illumination uniformity, total scan-integrated intensity, and symmetric insertion (in an attempt to minimize the pupil asymmetry induced by the uniformity correction system). Lithography scanners typically include integrated optical metrology components capable of measuring the light distribution about the illumination pupil, from which pupil asymmetry may be computed. Future scanners may be used for double exposure techniques that create the need for extremely tight overlay specifications because overlay error can cause critical dimension non-uniformity, leading to poor performance and low yield in the manufactured semiconductor devices. Pupil asymmetry may cause a focus-coupled image translation which, combined with typical focus errors, may make the new tight overlay specifications impossible to achieve.

Lithography scanners often use illumination systems that have asymmetric illumination pupils and scan-integrated pupil asymmetry that varies in the non-scanning direction. Normal use of the uniformity correction system (attenuating elements inserted to flatten uniformity) causes further non-zero scan-integrated pupil asymmetry that varies in the non-scanning direction. A uniformity correction system that is misaligned with respect to the illumination beam will tend to insert attenuating elements asymmetrically.

Since the existing attenuating element positioning algorithms consider intensity measurements only and not pupilgrams, the algorithms are forced to assume the illumination pupil fill inherent to the illumination beam is symmetric. The uniformity correction system is only a source of pupil asymmetry, and not an actuator for pupil asymmetry compensation.

Any of the above sources of pupil asymmetry may make tight overlay specifications impossible to achieve. What is needed is a system and method for reducing the scan-integrated pupil asymmetry.

SUMMARY

A uniformity correction system according to an embodiment of the present invention may be used as an actuator for the correction of a scan-integrated pupil asymmetry that varies in a non-scanning direction. Instead of minimizing asymmetric attenuating element insertion, pupilgrams are used to determine at each position (along the non-scanning direction) the correct asymmetric attenuating element insertion that will minimize the scan-integrated pupil asymmetry. Pupilgrams are taken during the calibration process to determine the correct positions of the uniformity correction system attenuating elements. An algorithm is utilized to compute an element position offset, which is utilized to shift opposing attenuating elements to optimize scan-integrated illumination uniformity and minimize scan-integrated pupil asymmetry. In order to actuate pupil asymmetry, the element position offset is used to shift one attenuating element into a beam and respective opposing attenuating element(s) out of the beam. Thus, unlike previous systems that shifted attenuating elements in a symmetric manner, a uniformity correction system, according to an embodiment of the present invention, shifts attenuating elements in an asymmetric manner. Iterative feedback of both uniformity and pupil asymmetry ensure that both are substantially simultaneously optimized.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of one skilled in the art to effect such feature, structure, or characteristic in connection with other embodiments whether or not explicitly described.

Figure 1:
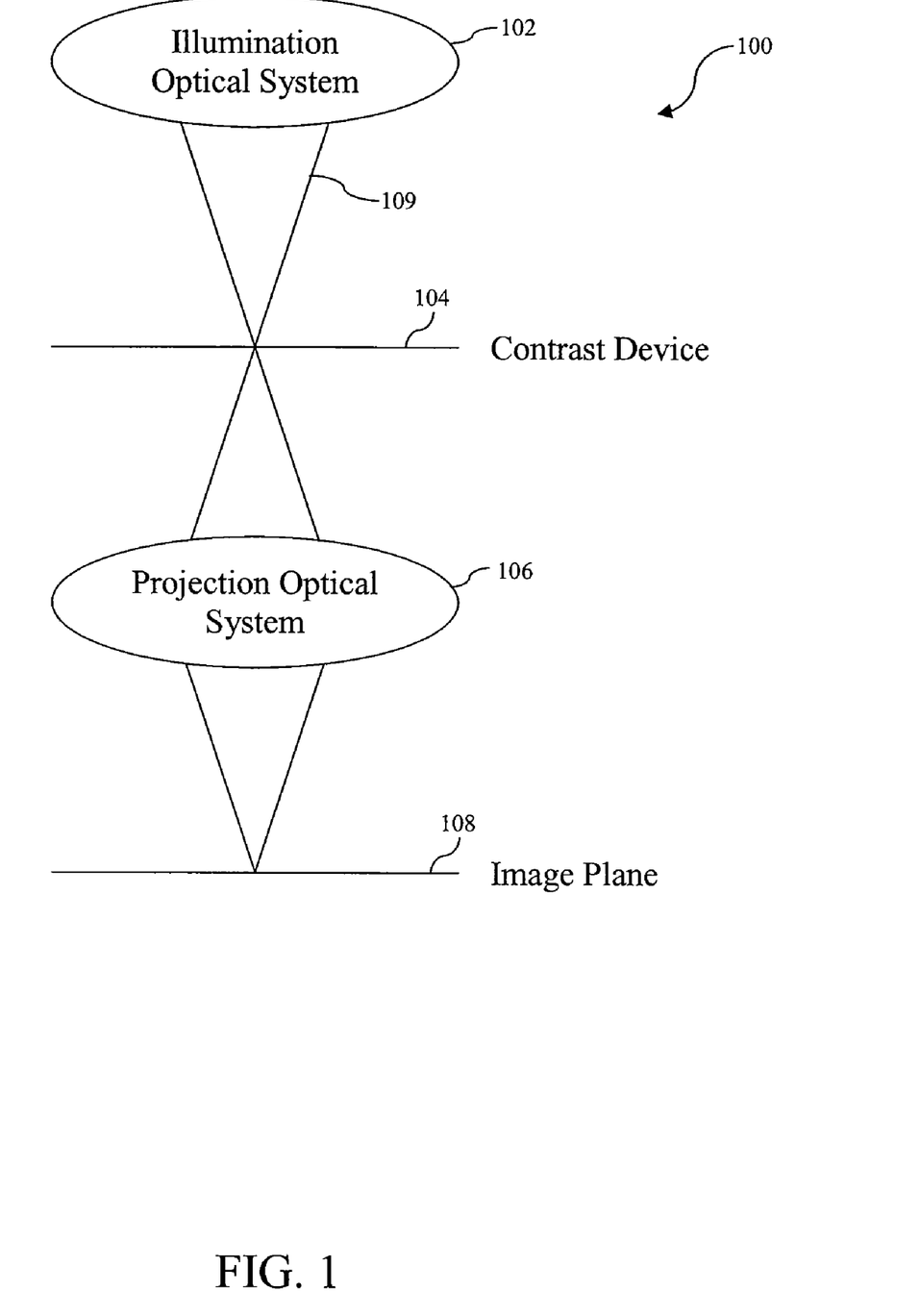
FIG. 1 represents the optical path of a typical lithography scanner.

FIG. 1 is an illustration of a typical lithography system 100 having an illumination optical system 102, a contrast device 104 (e.g., a reticle), projection optical system 106, and an image plane 108. Ideally, illumination optical system 102 produces a beam of light 109 that is uniform at image plane 108. Additionally, beam 109 produced by illumination optical system 102 is ideally incident on image plane 108 at a range of angles that are predefined in two dimensions, θ(x) and θ(y). The distribution of energy about the range of angles in the illumination pupil is called pupil fill.

Figure 2:
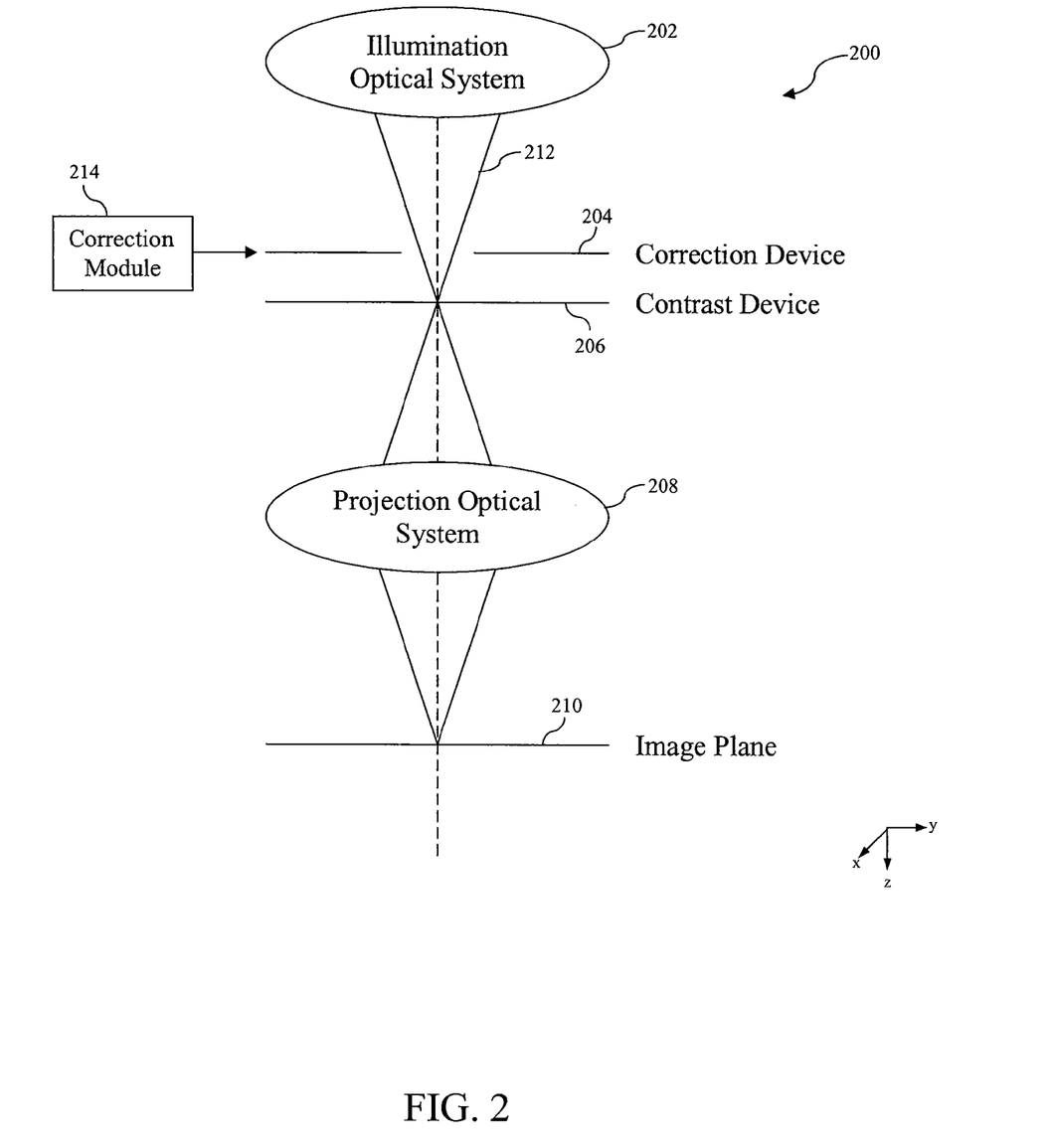
FIG. 2 represents an exemplary lithography scanner having a uniformity correction system adapted for pupil asymmetry, according to an embodiment of the present invention.

FIG. 2 is an illustration of an exemplary lithography system 200 according to an embodiment of the present invention. In an embodiment, lithography system 200 is a system using a reticle or mask. In an alternate embodiment, system 200 is a maskless lithography system.

Lithography system 200 includes, along a light path, illumination optical system 202, uniformity correction system 204, contrast device (also referred to herein as patterning device) 206, projection optical system 208, and image plane 210. In one example, uniformity correction system 204 controls illumination levels within specific sections of illumination fields associated with system 200. An example uniformity system is described in U.S. patent application Ser. No. 11/295,517, filed Dec. 7, 2005, and titled "System and Method for Uniformity Correction," which is incorporated by reference herein in its entirety.

Illumination optical system 202 outputs an illumination beam 212. Uniformity correction system 204 is positioned between illumination optics 202 and contrast device 206 at a defocus position. Thus, uniformity correction system 204 affects uniformity at contrast device 206. In one example, uniformity correction system 204 is located proximate to (e.g., within approximately 5 mm to 30 mm of) contrast device 206. In another example, uniformity correction system 204 is located between illumination optical system 202 and an intermediate focal plane (not shown).

Figure 3:
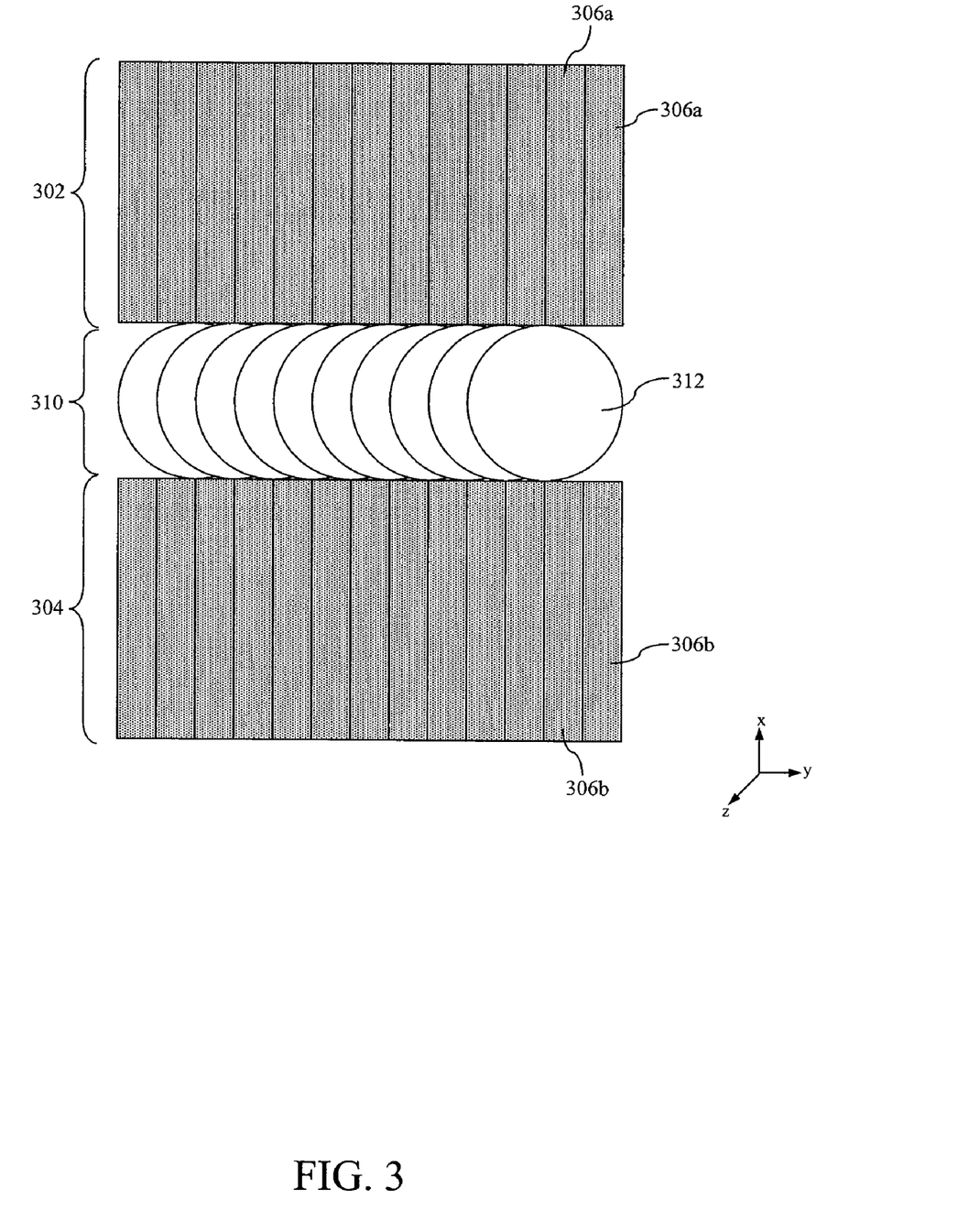
FIG. 3 illustrates a top view of a pupil asymmetry correction system, according to an embodiment of the present invention.

FIG. 3 is a top view of an exemplary uniformity correction system 204. Uniformity correction system 204 includes a top bank 302 of attenuating elements 306a and a bottom bank 304 of attenuating elements 306b. Attenuating elements 306 can be made out of metal or any other material that attenuates (e.g., partially or completely blocks) light at the particular wavelength used in an illumination beam (not shown). Individual attenuating elements 306a in top bank 302 and individual attenuating elements 306b in bottom bank 304 can extend separately into an aperture 310 along direction x. Attenuating elements 306 in top bank 302 and bottom bank 304 interact with the illumination beam traveling along an illumination axis z. As attenuating elements 306 are moved within the illumination beam, the characteristics of the beam are changed.

The pupils along the scan direction y within an aperture 310 are illustrated as pupils 312. In an ideal system, as shown in FIG. 3, the pupil is centered and aligned at all points along the scan direction y. To support a variety of pupil fill sizes, the position of uniformity correction system 204 may be variable with respect to contrast device 206. That is, uniformity correction system 204 may be moveable along the optical path with respect to contrast device 206. Uniformity correction system 204 corrects uniformity in illumination beam by inserting one or more attenuating elements 306 into illumination beam 212. Once the uniformity is corrected by uniformity correction system 204, illumination beam 212 illuminates contrast device 206.

In a first embodiment, contrast device 206 is a reticle. In a second, maskless embodiment, contrast device 206 is a programmable array of individually programmable elements. The programmable array may include a spatial light modulator ("SLM") or some other suitable reflective device, such as a micro-mirror array. Alternatively, the SLM is a transmissive device, such as a liquid crystal display ("LCD") or a grading light value ("GLV").

Projection optical system 208 is configured to project an image of contrast device 206 onto image plane 210. The details of projection optical system 212 are dependent on the type of lithography system used. Specific functional details of projection optics are well known to those skilled in the art and need not be further explained herein.

A substrate (not shown) may be placed at image plane 210. The substrate may be, for example and without limitation, a wafer, a piece of glass, a flat panel display, or the like. Alternatively, when a substrate is not present, a uniformity detection system (not shown) may be placed at image plane 210. The uniformity detection system detects and/or measures the uniformity profile at image plane 210, and communicates the profile to a correction module 214. Additionally, a pupil detection system (not shown) may be placed at (or near) image plane 210 (or at/near another focal plane). The pupil detection system captures a pupilgram, which detects and/or measures pupil fill. The pupilgram is then communicated to correction module 214 by the pupil detection system.

Figure 4:
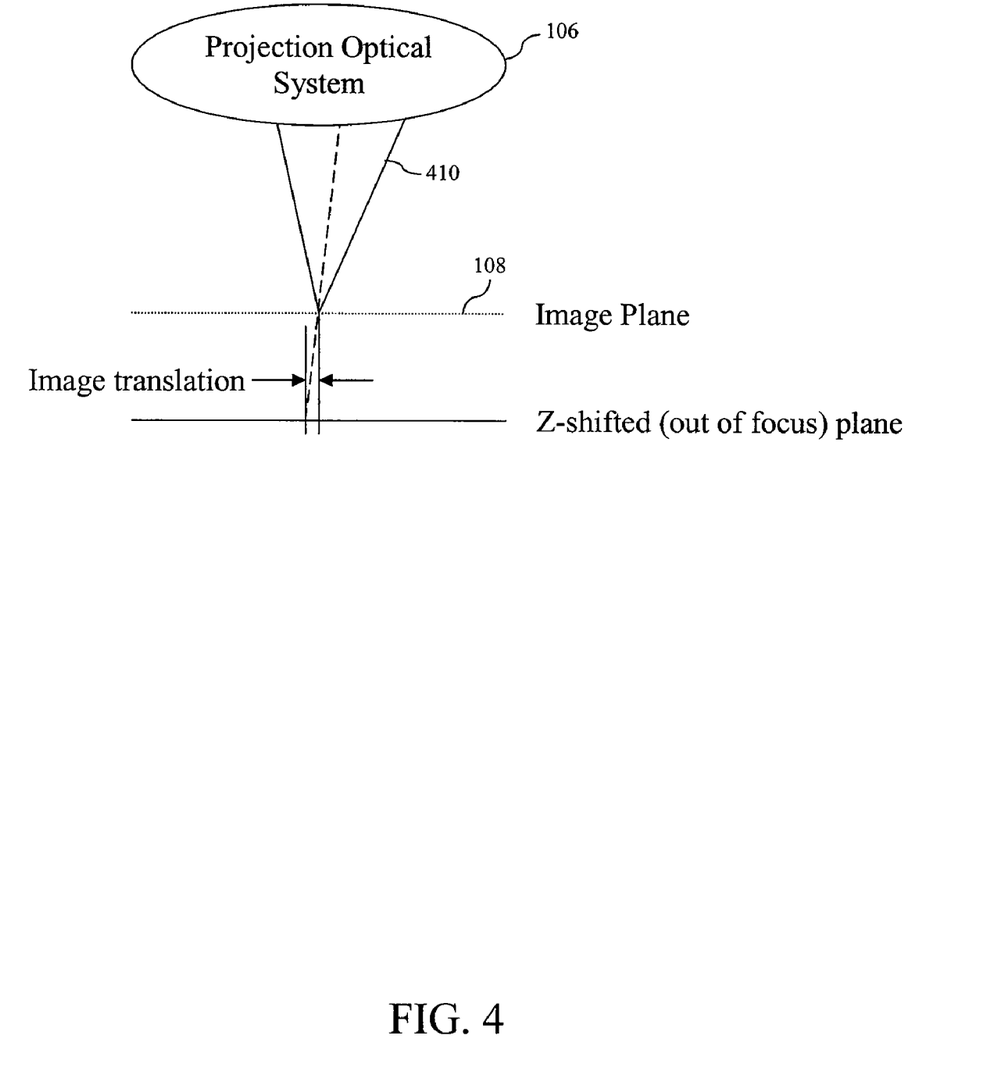
FIG. 4 illustrates the effect of pupil asymmetry on an image in a lithography scanner.

The role of pupil asymmetry in determining image translation is illustrated in FIG. 4. Light cone 410 converges to a focus at image plane 108 from a broad range of angles θ. The distribution of light energy within this range of angles is the pupil symmetry/asymmetry. If a substrate or detector (not shown) is located at a perfect image focus of system 100, pupil asymmetry does not affect the image position. However, if the substrate is even slightly defocused (e.g., offset in the z direction), a pupil asymmetry will cause the image to translate, and an overlay error occurs.

Figure 5:
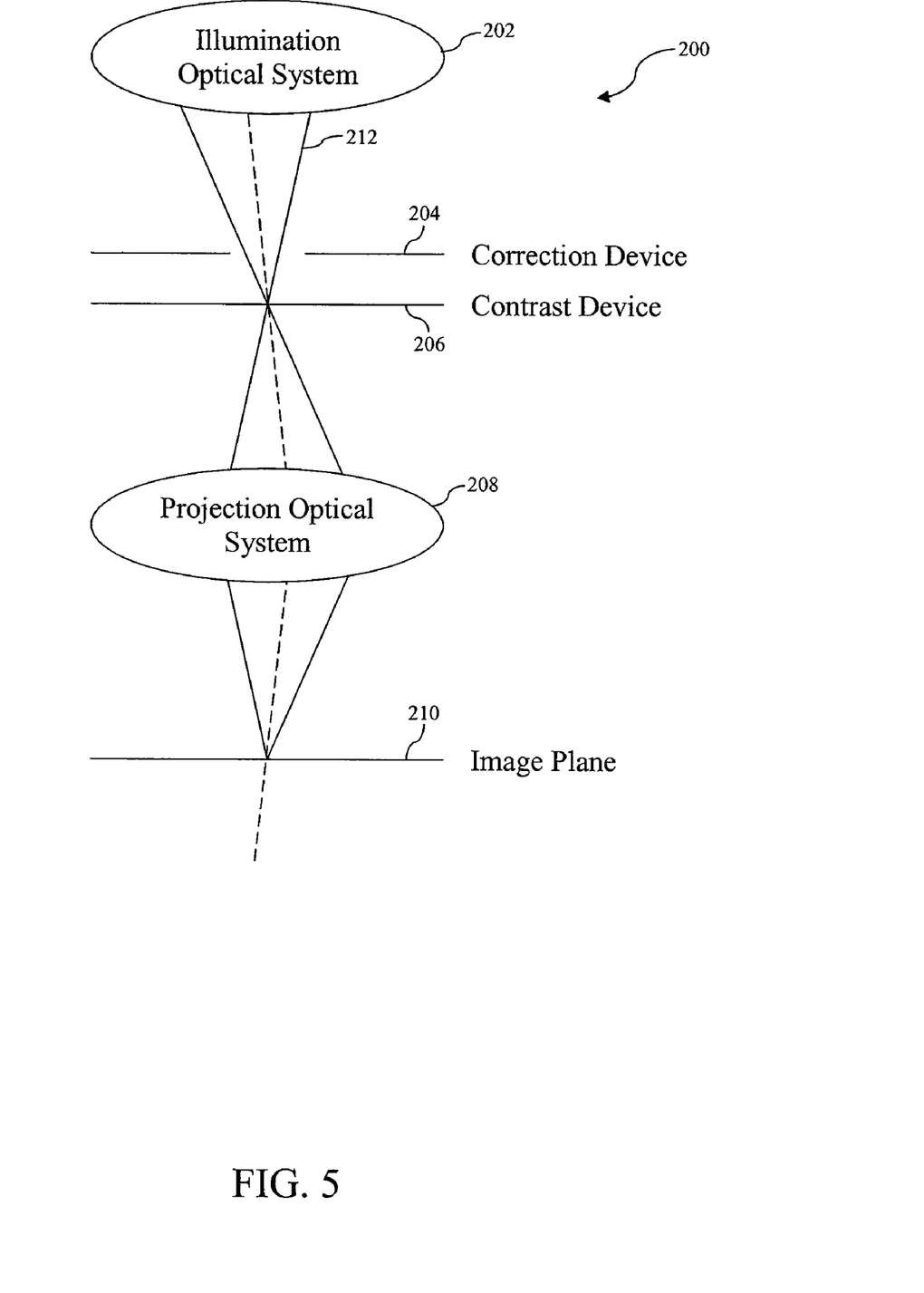
FIG. 5 illustrates an exemplary lithography scanner having an inherent pupil asymmetry in the illumination beam.

FIG. 5 is an illustration of lithography system 200 in which illumination beam 212 has a pupil asymmetry. That is, the centroid of the pupil fill incident on contrast device 206 (as well as on image plane 210) is shifted. This shifting of the pupil is further illustrated in FIG. 6 varying as a function of position in the non-scanning direction.

Figure 6:
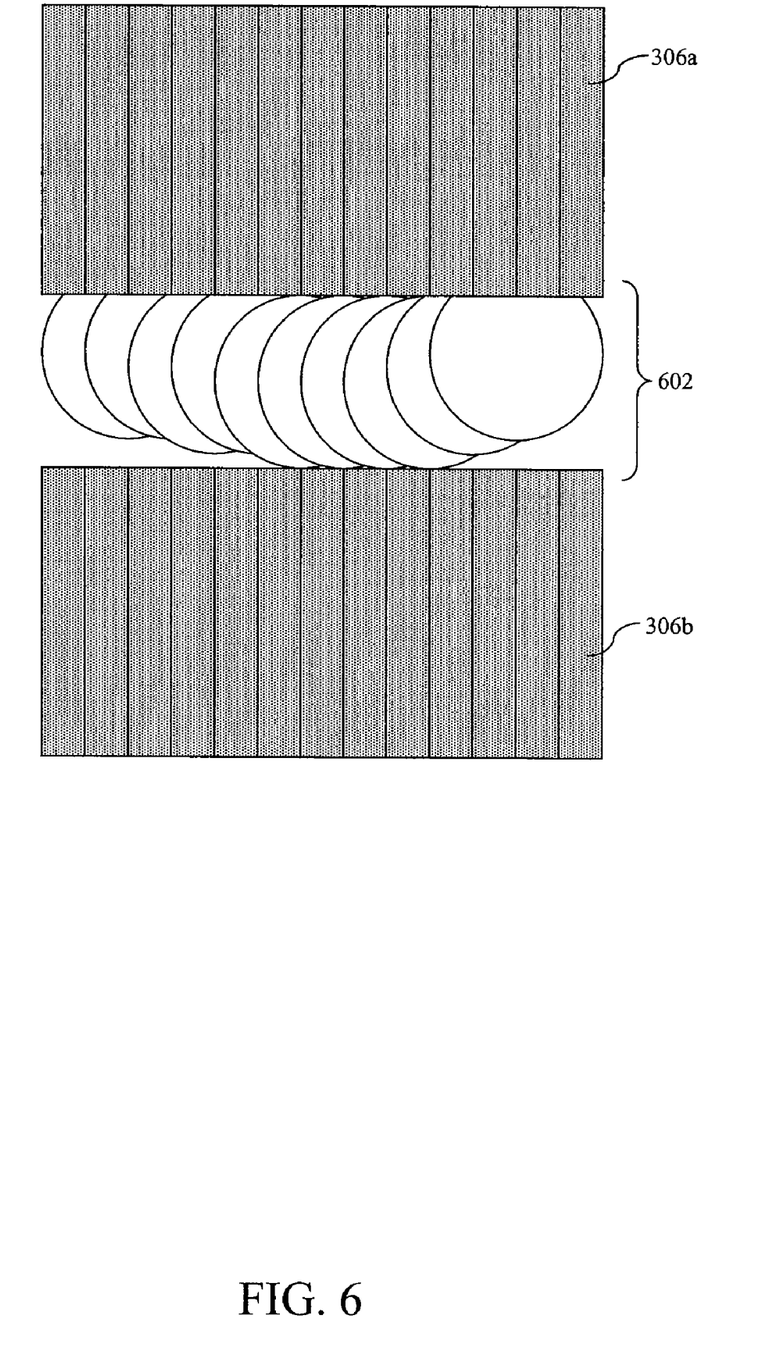
FIG. 6 illustrates a top view of the pupil fill profile of an illumination beam having an inherent pupil asymmetry, along with an exemplary pupil asymmetry correction system.

FIG. 6 represents a top view of the pupil fill in an asymmetric illumination beam relative to attenuating elements 306 in uniformity correction system 204 prior to correction of uniformity or pupil asymmetry by attenuating elements 306. When attenuating elements 306 are inserted into illumination beam 212, the insertion can cause an imbalance in illumination beam 212 and a corresponding shifting of the centroid of the pupil fill. The shifting of the pupil fill for various scan positions is illustrated as pupil fill profile 602.

Previous systems attempted to minimize the asymmetric insertion of attenuating elements 306. However, according to an embodiment of the present invention, if there is an existing pupil asymmetry inherent in lithography system 200, as shown in FIGS. 5 and 6, attenuating elements 306 in uniformity correction system 204 can be used to insert a second pupil asymmetry into illumination beam 212. In this manner, the first pupil asymmetry is substantially nulled by the second pupil asymmetry at image plane 210. Since uniformity correction system 204 includes multiple attenuating elements 306 extending along the non-scanning direction, the pupil asymmetry can be separately corrected over a range of positions in the non-scanning direction. This correction will be further described with respect to FIGS. 7 and 8.

Figure 8:
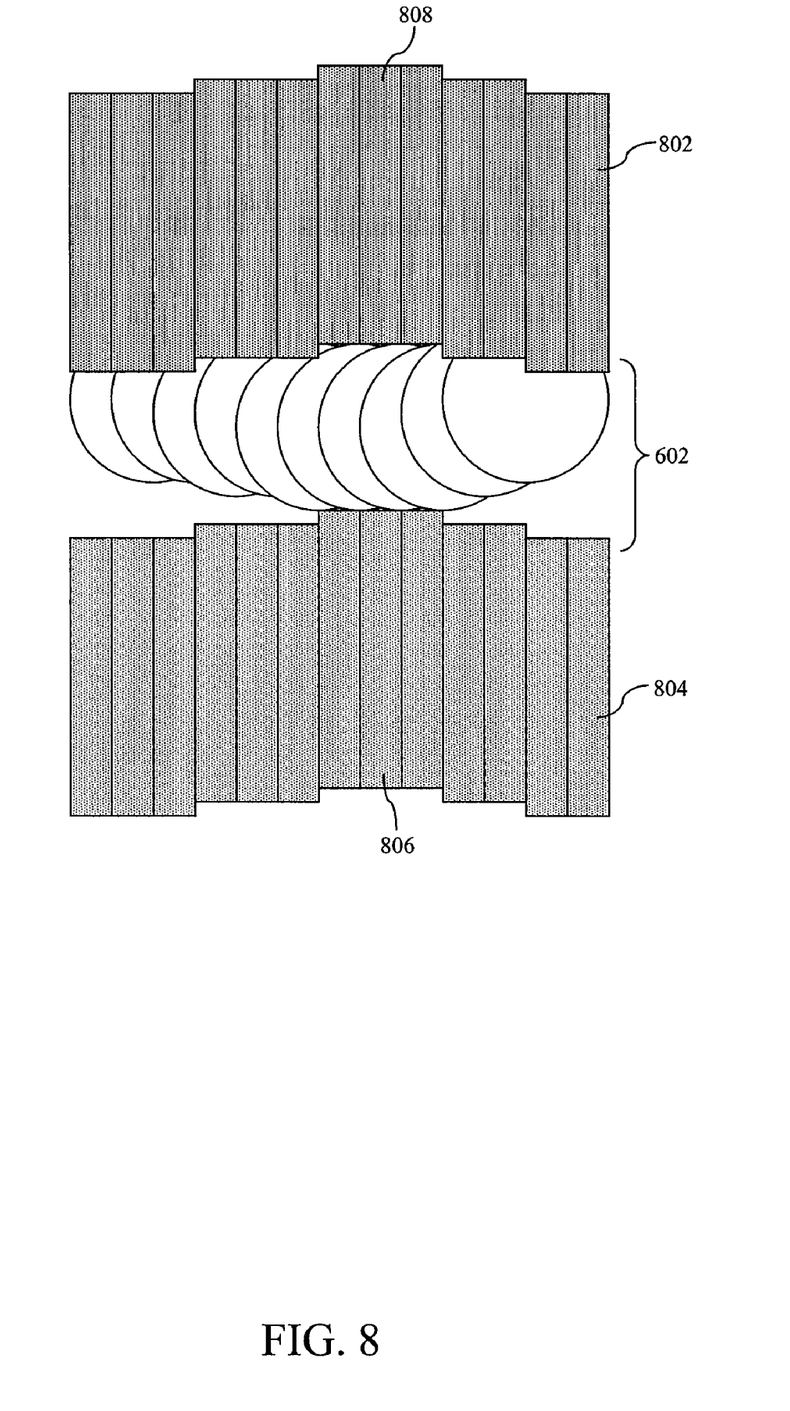
FIG. 8 illustrates a top view of an exemplary pupil asymmetry correction system configured to correct for a pupil asymmetry in an illumination beam, according to an embodiment of the present invention.

Returning to FIG. 2, correction module 214 is configured to determine the asymmetric adjustments to be effected by uniformity correction system 204 based on a pupilgram of illumination beam 212, such that both the desired uniformity and pupil asymmetry specifications are met. Such adjustments may include movement of an individual attenuating element (not shown, see FIGS. 6 and/or 8) into or out of illumination beam 212. As discussed, previous systems attempted to minimize asymmetric insertion of the attenuating elements by moving the attenuating elements symmetrically. However, in embodiments of the present invention, asymmetric insertion of the attenuating elements is not minimized. Instead, the uniformity profile measured at image plane 210 can be used to determine, at each position along the non-scanning direction, the correct attenuating element insertion asymmetricity that minimizes the scan-integrated pupil asymmetry. Correction module 214 communicates the determined adjustments to uniformity correction system 204 to control movement of attenuating elements within uniformity correction system 204.

The adjustments necessary to correct various pupil asymmetries can be determined by correction module 214 during a calibration of lithography system 200. In one embodiment, during calibration of lithography system 200, correction module 214 instructs uniformity correction system 204 to move a given attenuating element in tandem with its opposing attenuating element(s), such that the opposing (and sometimes neighboring) attenuating element(s) move out of illumination beam 212 when the given attenuating element is inserted into illumination beam 212. Pupil asymmetries existing at the time of calibration are thus removed through the tandem insertion/extraction of certain attenuating elements. Alternatively, attenuating element position adjustments for correction of both uniformity and pupil asymmetry as determined by correction module 214 can be calculated based on a previous calibration, in which the attenuating element insertion has been mapped against the pupil asymmetry and/or uniformity over a range of cross-scan coordinates.

Uniformity correction system 204 receives the adjustment control signals from correction module 214, and corrects non-uniform slit intensity profiles by moving the attenuating elements identified by the adjustment control signals asymmetrically into and out of illumination beam 209 in the scan direction. As will be illustrated with respect to FIG. 8, a given attenuating element and its opposing element(s) are synchronously moved, such that pupil asymmetry in the non-scanning direction is minimized at every position in the non-scanning direction.

Figure 7:
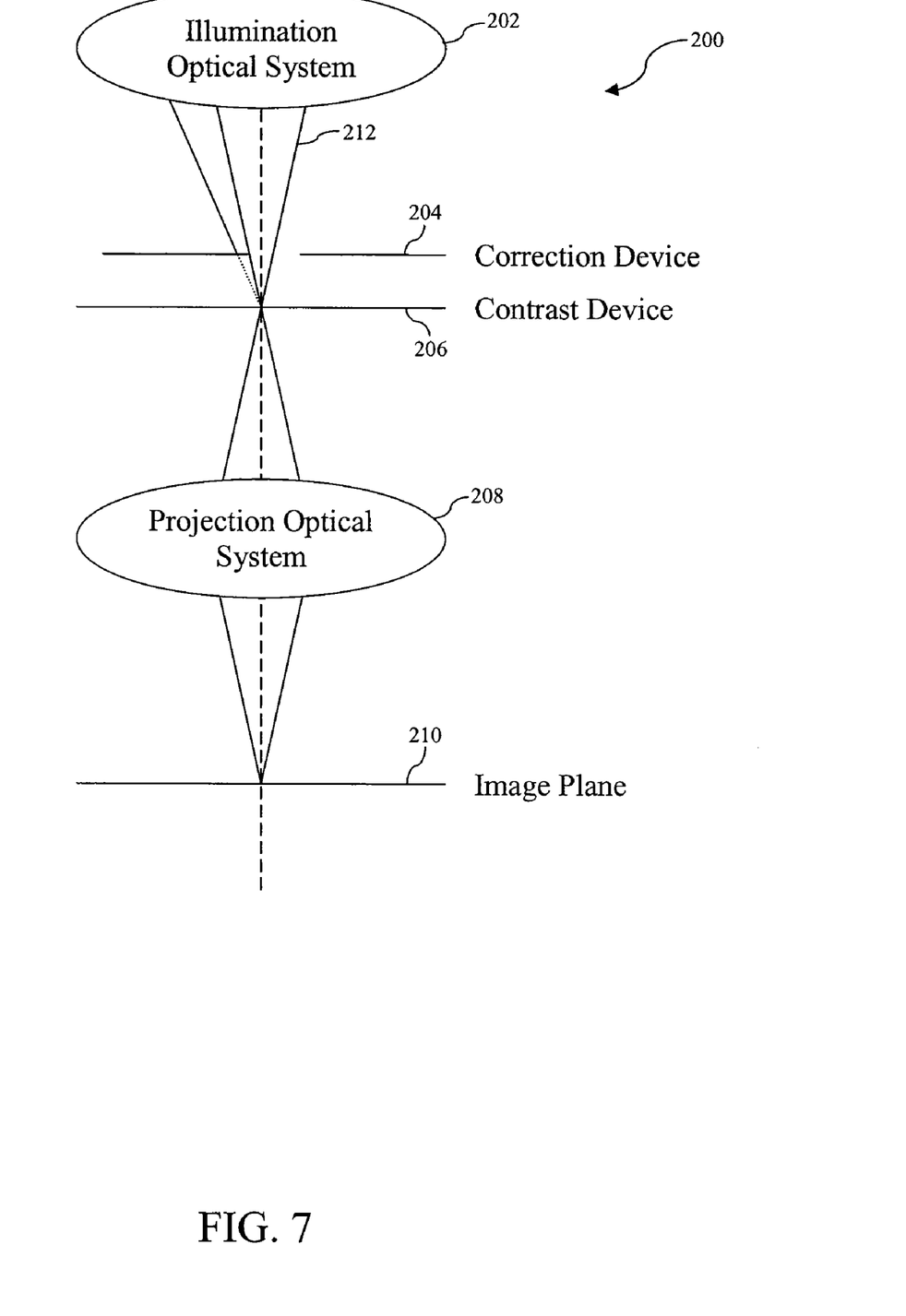
FIG. 7 illustrates an exemplary lithography scanner whose inherent pupil asymmetry has been corrected using a pupil asymmetry correction system according to an embodiment of the present invention.

FIG. 7 is an illustration of lithography system 200, in which uniformity correction system 204 is used to correct a pupil asymmetry inherent in illumination beam 212. Uniformity correction system 204 attenuates illumination beam 212 in order to shift the centroid of the pupil fill back into position.

FIG. 8 is a top view of asymmetrically inserted attenuating elements 306, according to an embodiment of the present invention. Attenuating elements 306 have been inserted asymmetrically to correct asymmetric pupil fill 602. As illustrated in FIG. 8, as a given attenuating element 802 is inserted into the illumination beam, a corresponding attenuating element 804, which is oriented opposite given attenuating element 802, is extracted from the illumination beam. Similarly, if another attenuating element 806 is inserted into the illumination beam, a corresponding attenuating element 808 is extracted from the illumination beam. In this way, uniformity of the illumination beam is maintained while the pupil asymmetry is corrected.

Figure 9:
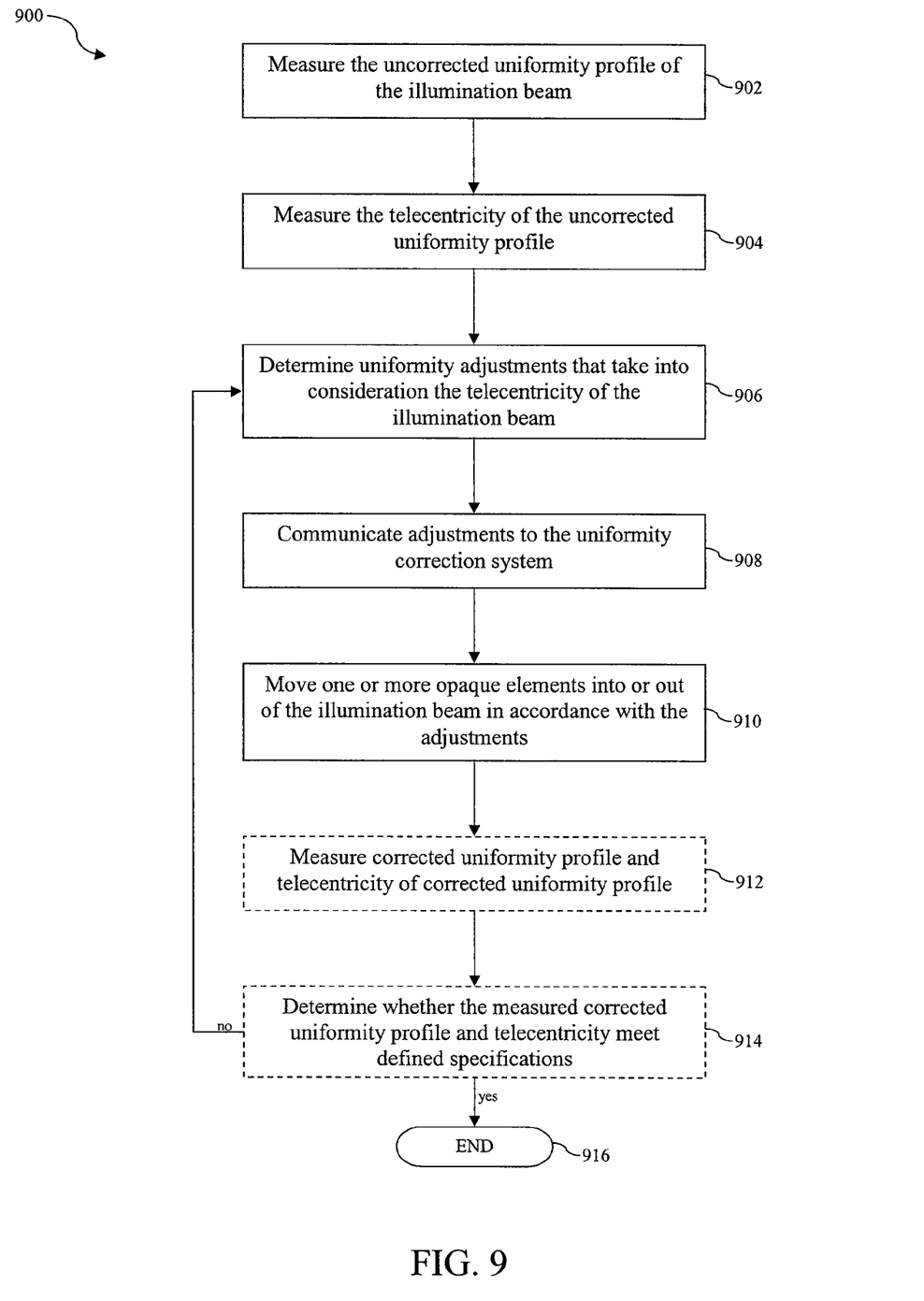
FIG. 9 is a flowchart of a method of correcting pupil asymmetry in a lithography system, according to an embodiment of the present invention.

FIG. 9 is a flowchart of an exemplary method 900 for correcting pupil asymmetry in an illumination beam of a lithography system, using a system designed according to an embodiment of the present invention, for example, one of the systems described above. Although the present description discusses correcting non-uniformities in pupil asymmetry, one of skill in the art will recognize that the uniformity correction system may be used to change other illumination effects that affect imaging performance, such as ellipticity and intensity.

In step 902, an uncorrected uniformity profile of the illumination beam is measured. Such a measurement can be made by, for example, placing a detector at an image plane. In step 904, the pupil asymmetry of the uncorrected uniformity profile is measured at multiple positions within the image (or object) field.

In step 906, uniformity adjustments are determined that take into consideration the pupil asymmetry of the illumination beam. Such adjustment determinations can be made by, for example, correction module 214 in FIG. 2. Correction module 214 can make the adjustment determinations based on, for example, a previously-calibrated map of correction element insertion versus pupil asymmetry and/or uniformity over a range of cross-scan coordinates. Alternatively, correction module 214 can make the adjustment determinations during calibration of the lithography system based on a pre-defined series of iterative steps requiring insertion of each attenuating element into the illumination beam to determine the effect on pupil asymmetry.

In step 908, the adjustments determined in step 906 are communicated, e.g., via control signals, to uniformity correction system 204. In step 910, uniformity correction system 204 moves one or more attenuating elements into or out of the illumination beam in accordance with the adjustments sent in step 908. To correct for pupil asymmetry, in an embodiment of the present invention, uniformity correction system 204 shifts one attenuating element into the beam while shifting its opposing attenuating element(s) out of the beam. Such shifting of opposing attenuating elements flattens uniformity and minimizes scan-integrated pupil asymmetry.

In optional step 912, the corrected uniformity profile is measured along with the pupil asymmetry of the corrected uniformity profile. The measurement can be made by, for example, a detector placed at the image plane.

In optional step 914, a determination is made as to whether the measured pupil asymmetry and uniformity meet defined specifications. If the measured pupil asymmetry and uniformity meet the defined specifications, method 900 proceeds to step 916. If the measured pupil asymmetry and/or uniformity do not meet the defined specifications, method 900 returns to step 906.

In step 916, method 900 ends.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

What is claimed is:

1. A method of correcting for pupil asymmetry in a lithography system, comprising:
    measuring a first pupil asymmetry of a uniformity profile of an illumination beam;
    determining positions of first and second attenuating elements of a plurality of attenuating elements arranged for compensating for the first pupil asymmetry, including
        referencing a map of pupil asymmetry caused by insertion of each element of the plurality of attenuating elements;
        identifying a second pupil asymmetry that substantially nulls the first pupil asymmetry; and
        determining, from the map, positions of the first and second attenuating elements that cause the second pupil asymmetry;
    moving the first attenuating element into the illumination beam, wherein the plurality of attenuating elements is located at a defocus position of the illumination beam; and
    moving the second attenuating element out of the illumination beam, the second attenuating element being located across the path of the illumination beam from the first attenuating element;
    wherein the first attenuating element and the second attenuating element are moved to positions that compensate for the first pupil asymmetry by introducing the second pupil asymmetry.

2. The method of claim 1, further comprising:
    measuring a non-uniformity of the illumination beam; and
    moving at least one attenuating element of the plurality of attenuating elements to minimize the non-uniformity.

3. The method of claim 1, further comprising:
    exposing a substrate with the illumination beam while the first and second attenuating elements are located at positions that compensate for the first pupil asymmetry.

4. The method of claim 1, wherein the moving the first attenuating element comprises moving the first attenuating element separately from the other attenuating elements of the plurality of attenuating elements.

5. A system for reducing pupil asymmetry of an illumination beam of a lithographic device, comprising:
    a first set of correction elements located perpendicular to a path of the illumination beam, each member of the first set of elements being independently movable; and
    a second set of correction elements located across the path of the illumination beam from the first set of correction elements, each member of the second set of elements being independently movable;
    wherein a first correction element of the second set of correction elements is configured to move out of the path of the illumination beam when a second correction element of the first set of correction elements that is opposite the first correction element is moved into the path of the illumination beam; and
    wherein the first and second sets of correction elements are moveable along the path of the illumination beam.

6. The system of claim 5, further comprising a detector for calculating the positions of the first correction element and the second correction element.

7. The system of claim 6, wherein the detector captures a pupilgram that identifies pupil asymmetry of the illumination beam.

8. The system of claim 5, wherein each correction element is moved in tandem with an oppositely-located one of the correction elements.

9. The system of claim 5, wherein along the path of the illumination beam the system further comprises:
    an illumination optical system;
    a patterning device;
    a projection optical system; and
    an image plane,
    wherein the first and second sets of correction elements are located at a defocus position in the illumination beam.

10. The system of claim 9, wherein the first and second sets of correction elements are located within about 5 to 30 mm of the contrast device.

11. The system of claim 9, wherein the first and second sets of correction elements are located at any position between the illumination optical system and the focal plane.

12. The system of claim 9, wherein the first and second sets of correction elements are located at any position between the illumination optical system and an intermediate focal plane.

13. The system of claim 5, wherein the first and second sets of correction elements correct both uniformity and pupil asymmetry.

14. A method of correcting for pupil asymmetry in a lithography system, comprising:
    measuring a first pupil asymmetry of a uniformity profile of an illumination beam;

determining positions of first and second attenuating elements of a plurality of attenuating elements arranged for compensating for the first pupil asymmetry, including inserting one of the attenuating elements of the plurality of attenuating elements into the illumination beam;

measuring a respective pupil asymmetry related to the insertion of the attenuating element;

repeating the inserting and measuring steps until all attenuating elements of the plurality of attenuating elements have been inserted and their respective pupil asymmetry measured;

identifying a second pupil asymmetry that substantially nulls the first pupil asymmetry; and determining the positions of the first and second attenuating elements that cause the second pupil asymmetry;

moving the first attenuating element into the illumination beam, wherein the plurality of attenuating elements is located at a defocus position of the illumination beam; and moving a second attenuating element out of the illumination beam, the second attenuating element being located across the path of the illumination beam from the first attenuating element;

wherein the first attenuating element and the second attenuating element are moved to positions that compensate for the first pupil asymmetry by introducing the second pupil asymmetry.

15. The method of claim 14, further comprising:

measuring a non-uniformity of the illumination beam; and moving at least one attenuating element of the plurality of attenuating elements to minimize the non-uniformity.

16. The method of claim 14, further comprising:

exposing a substrate with the illumination beam while the first and second attenuating elements are located at positions that compensate for the first pupil asymmetry.

17. The method of claim 14, wherein the moving the first attenuating element comprises moving the first attenuating element separately from the other attenuating elements of the plurality of attenuating elements.

* * * * *